(12) United States Patent
Jo et al.

(10) Patent No.: US 11,411,065 B2
(45) Date of Patent: Aug. 9, 2022

(54) DISPLAY DEVICE INCLUDING SYMMETRICALLY DISPOSED TRANSISTORS

(71) Applicant: SAMSUNG DISPLAY CO., LTD., Yongin-si (KR)

(72) Inventors: Kang Moon Jo, Hwaseong-si (KR); Young Wan Seo, Suwon-si (KR); Chong Chul Chai, Seoul (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

(21) Appl. No.: 16/940,904

(22) Filed: Jul. 28, 2020

(65) Prior Publication Data
US 2021/0057506 A1 Feb. 25, 2021

(30) Foreign Application Priority Data
Aug. 19, 2019 (KR) .......................... 10-2019-0101155

(51) Int. Cl.
*H01L 29/08* (2006.01)
*H01L 27/32* (2006.01)
*G09G 3/32* (2016.01)

(52) U.S. Cl.
CPC ...... *H01L 27/3276* (2013.01); *H01L 27/3262* (2013.01); *H01L 27/3265* (2013.01); *G09G 3/32* (2013.01); *G09G 2300/0426* (2013.01); *G09G 2320/0233* (2013.01)

(58) Field of Classification Search
CPC ............. H01L 27/3276; H01L 27/3262; H01L 27/3265; G09G 3/32
USPC .......................................................... 257/40
See application file for complete search history.

(56) References Cited

U.S. PATENT DOCUMENTS

| | | | |
|---|---|---|---|
| 10,102,803 B2 | 10/2018 | Park et al. | |
| 2016/0125809 A1* | 5/2016 | Hwang | G09G 3/3258 345/212 |
| 2016/0155983 A1* | 6/2016 | Lee | H01L 51/5281 257/40 |
| 2017/0140706 A1* | 5/2017 | Song | G09G 3/3233 |
| 2019/0189941 A1* | 6/2019 | Kim | H01L 27/1255 |

FOREIGN PATENT DOCUMENTS

| | | |
|---|---|---|
| KR | 10-2017-0052776 | 5/2017 |
| KR | 10-2017-0141304 | 12/2017 |
| KR | 10-2018-0068368 | 6/2018 |
| KR | 10-2018-0084998 | 7/2018 |
| KR | 10-2018-0091985 | 8/2018 |

* cited by examiner

*Primary Examiner* — Phuc T Dang
(74) *Attorney, Agent, or Firm* — F. Chau & Associates, LLC

(57) ABSTRACT

A display device includes a first pixel including a first transistor, a second transistor, and a third transistor, a second pixel disposed adjacent to the first pixel in a first direction, and including a first transistor, a second transistor, and a third transistor, and an initialization voltage line disposed between the first pixel and the second pixel, and extending in a second direction crossing the first direction. The second transistor of the first pixel and the second transistor of the second pixel are connected to the initialization voltage line. The first, second, and third transistors of the first pixel and the first, second, and third transistors of the second pixel are symmetrical with respect to the initialization voltage line.

9 Claims, 11 Drawing Sheets

DISPLAY DEVICE INCLUDING SYMMETRICALLY DISPOSED TRANSISTORS

CROSS-REFERENCE TO RELATED APPLICATIONS

This application claims priority under 35 U.S.C. § 119 to Korean Patent Application No. 10-2019-0101155, filed on Aug. 19, 2019, the disclosure of which is incorporated by reference herein in its entirety.

TECHNICAL FIELD

This disclosure relates to a display device.

DISCUSSION OF THE RELATED ART

A display device, such as a light emitting display device, includes a display panel in which pixels displaying an image are disposed. Each pixel may include a light emitting diode, as well as transistors and capacitors that control the light emitting diode to emit light having a predetermined luminance at a predetermined timing. Signal lines that apply or transmit a signal and/or a voltage to the pixels are disposed in the display panel.

The display device may provide a clear and vivid image when resolution is high. Resolution may be increased by increasing the number of pixels disposed in the display area of the display panel. Thus, increasing the degree of integration of pixels and signal lines in the display device, while not deteriorating other characteristics, may result in a display device having improved image quality.

SUMMARY

Embodiments provide a display device that can increase the degree of integration of pixels and signal lines, and improve writing efficiency of a data voltage.

A display device according to an embodiment includes a first pixel including a first transistor, a second transistor, and a third transistor, a second pixel disposed adjacent to the first pixel in a first direction and including a first transistor, a second transistor, and a third transistor, and an initialization voltage line disposed between the first pixel and the second pixel and extending in a second direction crossing the first direction. The second transistor of the first pixel and the second transistor of the second pixel are connected to the initialization voltage line. The first, second, and third transistors of the first pixel and the first, second, and third transistors of the second pixel are symmetrical with respect to the initialization voltage line.

In an embodiment, the second transistor of the first pixel and the second transistor of the second pixel share a source electrode.

In an embodiment, the initialization voltage line overlaps the source electrode and is connected to the source electrode.

In an embodiment, the display device further includes a data line that extends in the second direction across the first pixel, an insulation layer disposed on the data line, and a capacitor electrode that overlaps the data line. The initialization voltage line and the capacitor electrode are disposed on and in contact with the insulation layer.

In an embodiment, the capacitor electrode is connected to a drain electrode of the first transistor of the first pixel.

In an embodiment, the display device further includes a driving voltage line that extends in the second direction. The capacitor electrode is disposed between the initialization voltage line and the driving voltage line.

In an embodiment, the display device further includes another initialization voltage line that extends in the first direction across the first pixel and the second pixel. The another initialization voltage line is connected to the initialization voltage line. The another initialization voltage line includes a capacitor electrode that overlaps a gate electrode of the first transistor of the first pixel.

In an embodiment, the display device further includes a scan line connected to a gate electrode of the second transistor of the first pixel and a gate electrode of the second transistor of the second pixel, and extending in the first direction, and an insulation layer disposed between the scan line and the gate electrode of the first transistor of the first pixel. The scan line and the another initialization voltage line are disposed on and in contact with the insulation layer.

In an embodiment, in each of the first pixel and the second pixel, a drain electrode of the first transistor is connected to a drain electrode of the second transistor and a drain electrode of the third transistor, and a gate electrode of the first transistor is connected to a source electrode of the third transistor.

In an embodiment, a source electrode, a channel region, and a drain electrode of the second transistor of the first pixel and a source electrode, a channel region, and a drain electrode of the second transistor of the second pixel form a "T" shape.

A display device according to an embodiment includes a substrate, an active pattern disposed on the substrate and including a first source electrode, a first drain electrode, and a first channel region of a first transistor, a first insulation layer disposed on the active pattern, a first gate electrode disposed on the first insulation layer and overlapping the first channel region, a second insulation layer disposed on the first gate electrode, a first initialization voltage line disposed on the second insulation layer and forming a first capacitor with the first gate electrode, a third insulation layer disposed on the first initialization voltage line, a data line disposed on the third insulation layer, a fourth insulation layer disposed on the data line, and a capacitor electrode disposed on the fourth insulation layer and forming a second capacitor with the data line.

In an embodiment, the capacitor electrode is connected to the first drain electrode through an opening formed in the first, second, third, and fourth insulation layers.

In an embodiment, the display device further includes a driving voltage line disposed on the fourth insulation layer, and connected to the first source electrode through an opening formed in the first, second, third, and fourth insulation layers.

In an embodiment, the display device further includes a second initialization voltage line disposed on the fourth insulation layer, and connected to the first initialization voltage line through an opening formed in the third and fourth insulation layers.

In an embodiment, the active pattern further includes a second source electrode, a second drain electrode, and a second channel region of a second transistor, and the second initialization voltage line is connected to the second source electrode through an opening formed in the first, second, third, and fourth insulation layers.

In an embodiment, the display device further includes a second gate electrode of the second transistor disposed between the first insulation layer and the second insulation layer and overlapping the second channel region, and a scan line disposed between the second insulation layer and the third insulation layer. The scan line is connected to the second gate electrode through an opening formed in the second insulation layer.

In an embodiment, the active pattern further includes a third source electrode of a third transistor, and the display device further includes a connection member that connects the first gate electrode and the third source electrode through an opening formed in the first and second insulation layers.

In an embodiment, the first initialization voltage line extends in a first direction and the data line extends in a second direction that crosses the first direction, and a maximum length or width of the opening is larger in the second direction than in the first direction.

In an embodiment, the display device further includes a gate line disposed between the first insulation layer and the second insulation layer, and including a third gate electrode of a third transistor.

In an embodiment, the display device further includes a fifth insulation layer disposed on the capacitor electrode, and an electrode of a light emitting diode disposed on the fifth insulation layer. The electrode of the light emitting diode is connected to the capacitor electrode through an opening formed in the fifth insulation layer.

According to embodiments, a display device capable of increasing the degree of integration of pixels and signal lines, and improving writing efficiency of data voltages, is provided.

BRIEF DESCRIPTION OF THE DRAWINGS

The above and other features of the present inventive concept will become more apparent by describing in detail embodiments thereof with reference to the accompanying drawings, in which.

DETAILED DESCRIPTION OF THE EXEMPLARY EMBODIMENTS

Figure 1:
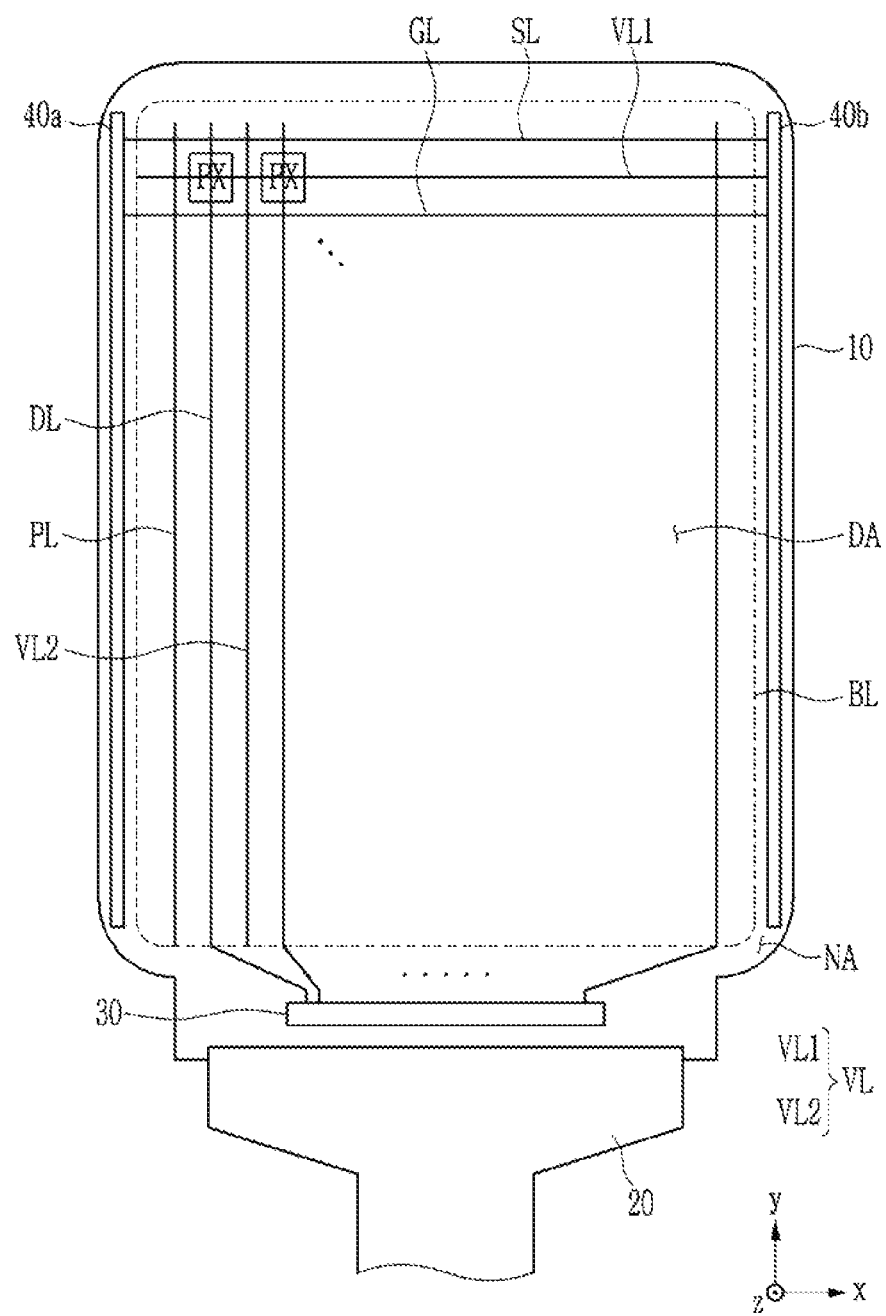
FIG. 1 is a schematic top plan view of a display device according to an embodiment.

Embodiments will be described more fully hereinafter with reference to the accompanying drawings. Like reference numerals may refer to like elements throughout the accompanying drawings.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. Other words used to describe the relationship between elements should be interpreted in a like fashion.

It will be understood that the terms "first," "second," "third," etc. are used herein to distinguish one element from another, and the elements are not limited by these terms. Thus, a "first" element in an embodiment may be described as a "second" element in another embodiment.

It should be understood that descriptions of features or aspects within each embodiment should typically be considered as available for other similar features or aspects in other embodiments, unless the context clearly indicates otherwise.

As used herein, the singular forms "a", "an" and "the" are intended to include the plural forms as well, unless the context clearly indicates otherwise.

In addition, unless explicitly described to the contrary, the word "comprise" and variations such as "comprises" or "comprising" will be understood to imply the inclusion of stated elements but not the exclusion of any other elements.

In this specification, the phrase "in a plan view" means viewing a target portion from the top, and the phrase "in a cross-section" means viewing a cross-section formed by vertically cutting a target portion from the side.

In the drawing, the symbol x denotes a first direction, the symbol y denotes a second direction that is perpendicular to the first direction, and the symbol z denotes a third direction that is perpendicular to the first direction and the second direction.

FIG. 1 is a schematic top plan view of a display device according to an embodiment.

Referring to FIG. 1, a display device according to an embodiment includes a display panel 10. The display panel 10 includes a display area DA and a non-display area NA. The non-display area NA is disposed at the periphery of the display area DA, and various elements and/or signal lines for generating and/or transmitting various signals applied to the display area DA are disposed in the non-display area NA. The display area DA may be located inside a boundary BL, which is illustrated by dotted lines, and the non-display area NA may be located outside the boundary BL. The display area DA may correspond to a screen of an electronic device.

Pixels PX are arranged, for example, in a matrix format in the display area DA of the display panel 10. In the display area DA, signal lines such as, for example, data lines DL, scan lines SL, and gate lines GL are disposed. The scan lines SL and the gate lines GL may substantially extend in a first direction x (e.g., a row direction), and the data lines DL may extend in a second direction y (e.g., a column direction) that crosses the first direction x. Each pixel PX is connected to a scan line SL, a gate line GL, and a data line DL, and may receive a scan signal, a gate signal, and a data voltage (also called a data signal) from the signal lines. In the display area DA, driving power lines PL that transmit a driving voltage ELVDD to the pixels PX may be disposed, and initialization voltage lines VL that transmit an initialization voltage VINT to the pixels PX may be disposed. The driving voltage line PL may substantially extend in the second direction y. The initialization voltage lines VL may include a first initialization voltage line VL1 substantially extending in the first direction x, and a second initialization voltage VL2 connected to the first initialization voltage line VL1 and substantially extending in the second direction y. The first initialization voltage lines VL1 and the second initialization voltage lines VL2 may be arranged in a mesh shape.

The display panel 10 may include touch electrodes (also called touch sensor layers) for sensing contact or non-contact touch of a user. The touch electrodes may be primarily disposed in the display area DA. Although the display area DA is shown to have a rounded quadrangular shape in FIG. 1, embodiments are not limited thereto. For example, in embodiments, the display area DA may have various shapes such as a polygon (e.g., a rectangle), a circle, an oval, etc.

A pad portion that includes pads for receiving signals from the outside of the display panel 10 may be disposed in the non-display area NA of the display panel 10. The display device may include a flexible printed circuit layer 20 connected (e.g., joined) to the pad portion of the display panel 10. An end of the flexible printed circuit layer 20 is connected to a printed circuit board, and thus may receive a signal such as video data, and may receive a power voltage such as a driving voltage ELVDD, a common voltage ELVSS, etc.

A driving device that generates and/or processes various signals for driving the display panel 10 may be disposed in the non-display area NA, or may be disposed in the flexible printed circuit layer 20 connected to the pad portion. The driving device may include a data driver applying a data voltage to the data line DL, a scan driver applying a scan signal to the scan line SL, a gate driver applying a gate signal to the gate line GL, and a signal controller that controls the data driver, the scan driver, and the gate driver.

The scan driver and the gate driver may be integrated with the non-display area NA of the display panel 10 as driving circuits 40a and 40b. The driving circuits 40a and 40b may include a driving circuit 40a disposed at one side of the display area DA and a driving circuit 40b disposed at the opposing side of the display area DA, and may extend in the second direction y. Each of the driving circuits 40a and 40b may include a scan driver and/or a gate driver. The driving circuits 40a and 40b may be electrically connected to the scan line SL and/or the gate line GL. The driving circuits 40a and 40b may include, for example, shift registers to which stages are dependently connected, and each stage may include transistors and capacitors. Each stage may generate and output a scan signal and/or a gate signal.

The data driver and signal controller may be provided as integrated circuit (IC) chips 30. The IC chip 30 may be disposed in the non-display area NA of the display panel 10. The IC chips 30 may be disposed in the flexible printed circuit layer 20. The data driver and the signal controller may be formed as a single chip or may be formed as individual chips.

Figure 2:
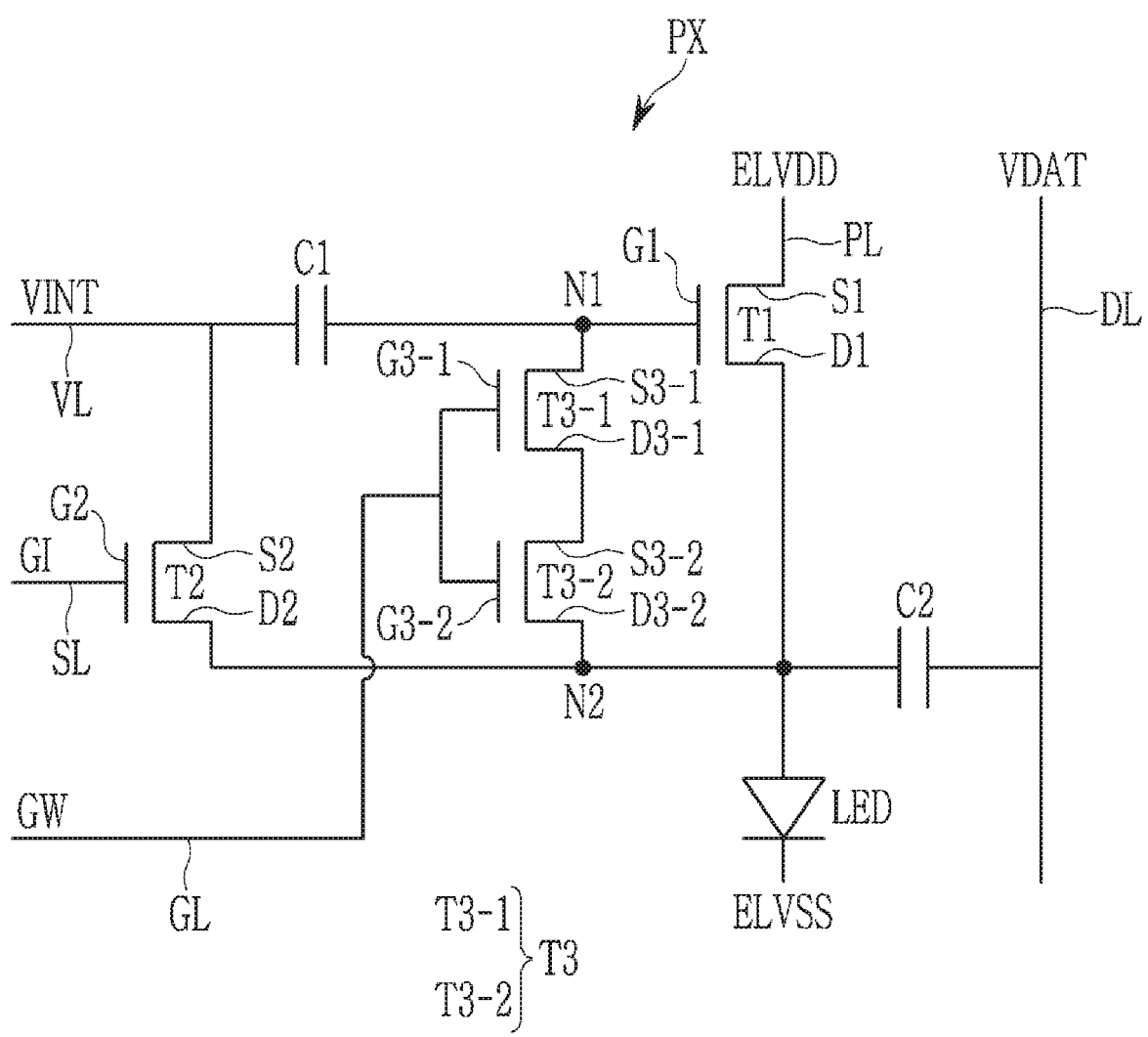
FIG. 2 is an equivalent circuit diagram of a pixel of a display device according to an embodiment.

FIG. 2 is an equivalent circuit diagram of a pixel of a display device according to an embodiment.

Referring to FIG. 2, a pixel PX may include three transistors T1, T2, and T3, two capacitors C1 and C2, and a light emitting diode LED, which are directly and indirectly connected to signal lines DL, SL, GL, PL, and VL.

The signal lines DL, SL, GL, PL, and VL may include a data line DL transmitting a data voltage VDAT, a scan line SL transmitting a scan signal GI, a gate line GL transmitting a gate signal GW, a driving voltage signal PL transmitting a driving voltage ELVDD, and an initialization voltage line VL transmitting an initialization voltage VINT.

The transistors T1, T2, and T3 include a first transistor T1, a second transistor T2, and a third transistor T3. The transistors T1, T2, and T3 may be, for example, N-type transistors. However, embodiments are not limited thereto. For example, in embodiments, the transistors T1, T2, and T3 may be P-type transistors, or may include both N-type transistors and P-type transistors.

The first transistor T1 includes a first gate electrode G1 (also called a control electrode) connected to a first node N1, a first source electrode S1 (also called a first electrode or an input electrode) connected to the driving voltage line PL, and a first drain electrode D1 (also called a second electrode or an output electrode) connected to a second node N2. The first transistor T1 is a transistor that outputs a driving current to the light emitting diode LED, and may be called a driving transistor.

The driving voltage ELVDD applied to the first source electrode S1 through the driving voltage line PL may have a high-level high voltage or a low-level low voltage.

The second transistor T2 includes a second gate electrode G2 connected to the scan line SL, a second source electrode S2 connected to the initialization voltage line VL, and a second drain electrode D2 connected to the second node N2. The scan signal GI applied to the second gate electrode G2 through the scan line SL may have a high voltage or a low voltage for turning the second transistor T2 on or off.

The initialization voltage VINT applied through the initialization voltage line VL may have a high voltage for turning on the first transistor T1, a low voltage for initializing an anode of the light emitting diode LED, and a reset voltage for resetting the anode. The reset voltage may be lower or higher than the low voltage of the initialization voltage VINT.

The third transistor T3 may have a structure in which two transistors, for example, a first third transistor T3-1 and a second third transistor T3-2, are connected. Utilization of such a two-transistor structure may prevent a leakage current. The first third transistor T3-1 includes a gate electrode G3-1 connected to the gate line GL, a source electrode S3-1 connected to the first node N1, and a drain electrode D3-1 connected to a source electrode S3-2 of the second third transistor T3-2. The second third transistor T3-2 includes a gate electrode G3-2 connected to the gate line GL, the source electrode S3-2 connected to the drain electrode D3-1 of the first third transistor T3-1, and a drain electrode D3-2 connected to the second node N2. The source electrode S3-1 and the drain electrode D3-2 may respectively correspond to a source electrode and a drain electrode of the third transistor T3, and the gate electrode G3-1 and the gate electrode G3-2 may correspond to a gate electrode of the third transistor T3.

The gate signal GW applied to the gate electrodes G3-1 and G3-2 through the gate line GL may have a high voltage or a low voltage for turning the third transistor T3 on or off.

The first capacitor C1 is connected between the initialization voltage line VL and the first node N1. The first capacitor C1 may store a voltage of the first node N1. The first capacitor C1 may also be called a storage capacitor.

The second capacitor C2 is connected between the second node N2 and the data line DL. The second capacitor C2 can write a data voltage VDAT transmitted through the data line DL. The second capacitor C2 may also be called a programming capacitor.

The first and second capacitors C1 and C2 may be coupled in series by the third transistor T3, and the data voltage VDAT may be divided by the first and second capacitors C1 and C2 and then applied to the first node N1.

The light emitting diode LED includes the anode connected to the second node N2 and a cathode receiving the common voltage ELVSS. When the first transistor T1 is turned on, a driving current corresponding to the data voltage VDAT applied to the first node N1 flows through the LED such that the light emitting diode LED may emit light with a predetermined luminance. A manner of driving the pixel PX will be described in further detail below.

Referring to FIGS. 3 to 10, a pixel structure of a pixel of a display device according to an embodiment will be described in detail.

Figure 3:
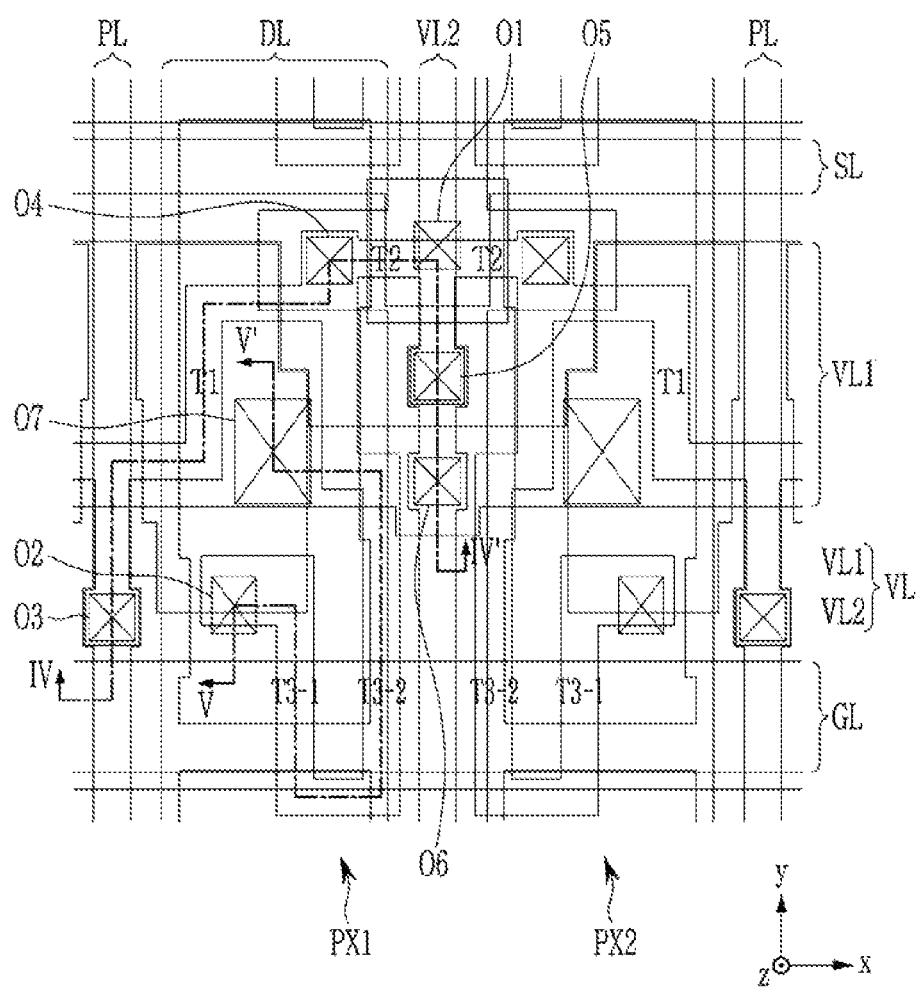
FIG. 3 is a layout view of two pixel areas of a display device according to an embodiment.
Figure 4:
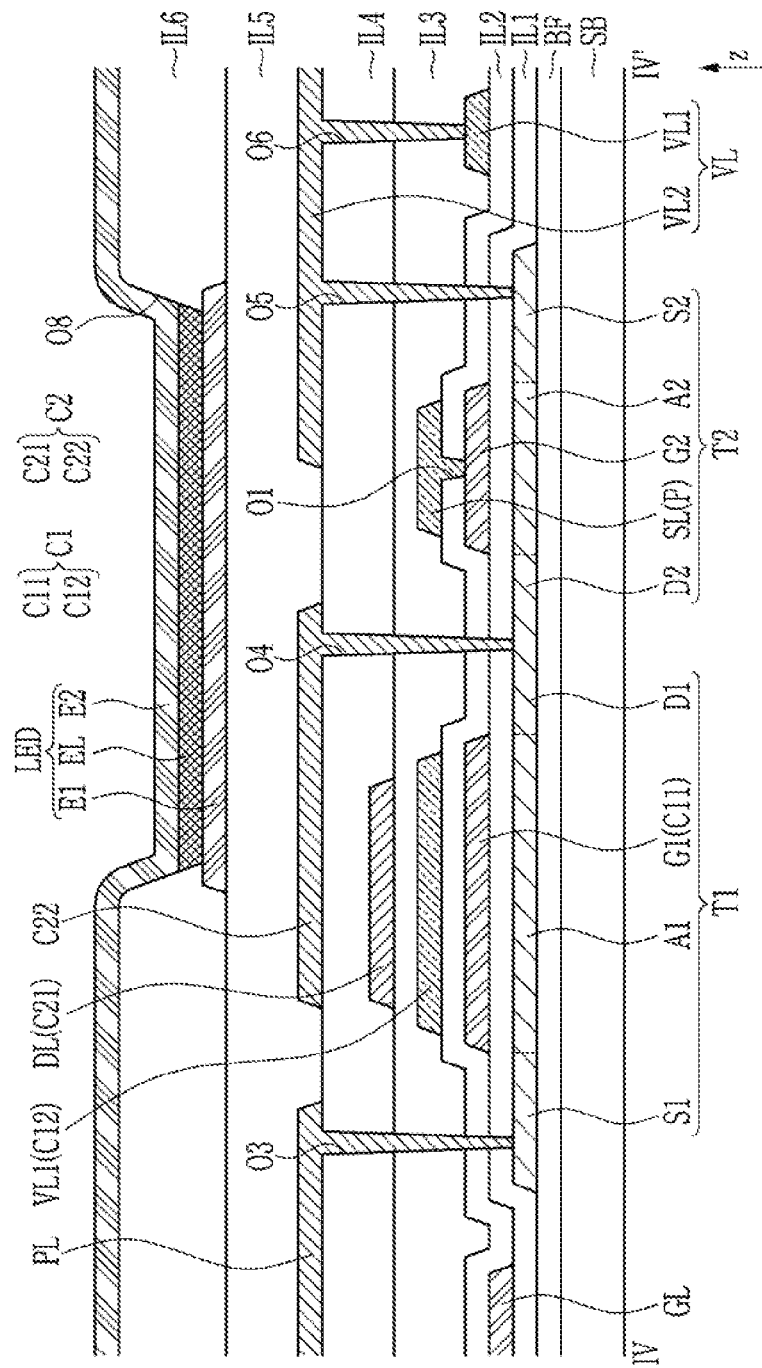
FIG. 4 is a cross-sectional view of the display device of FIG. 3 taken along line IV-IV' according to an embodiment.
Figure 5:
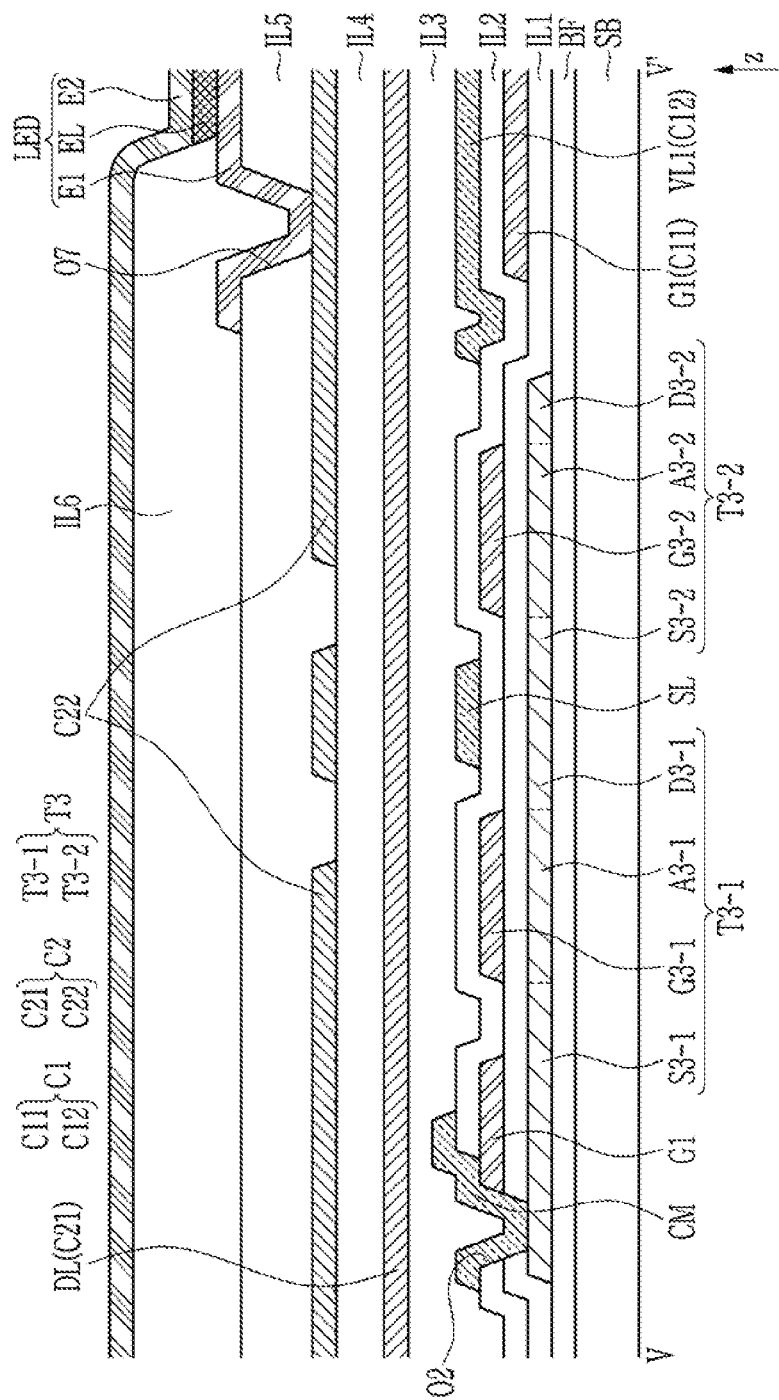
FIG. 5 is a cross-sectional view of the display device of FIG. 3 taken along line V-V' according to an embodiment.
Figure 6:
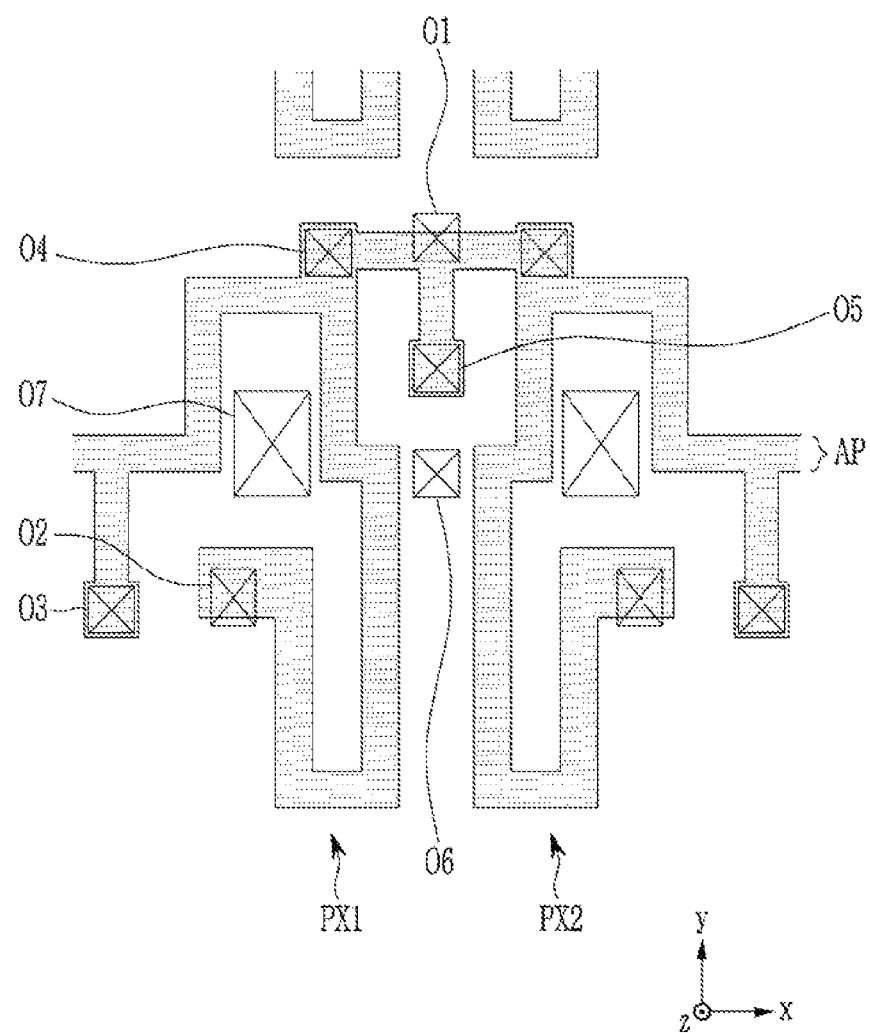
FIG. 6 is a top plan view illustrating only an active pattern of FIG. 3 according to an embodiment.
Figure 7:
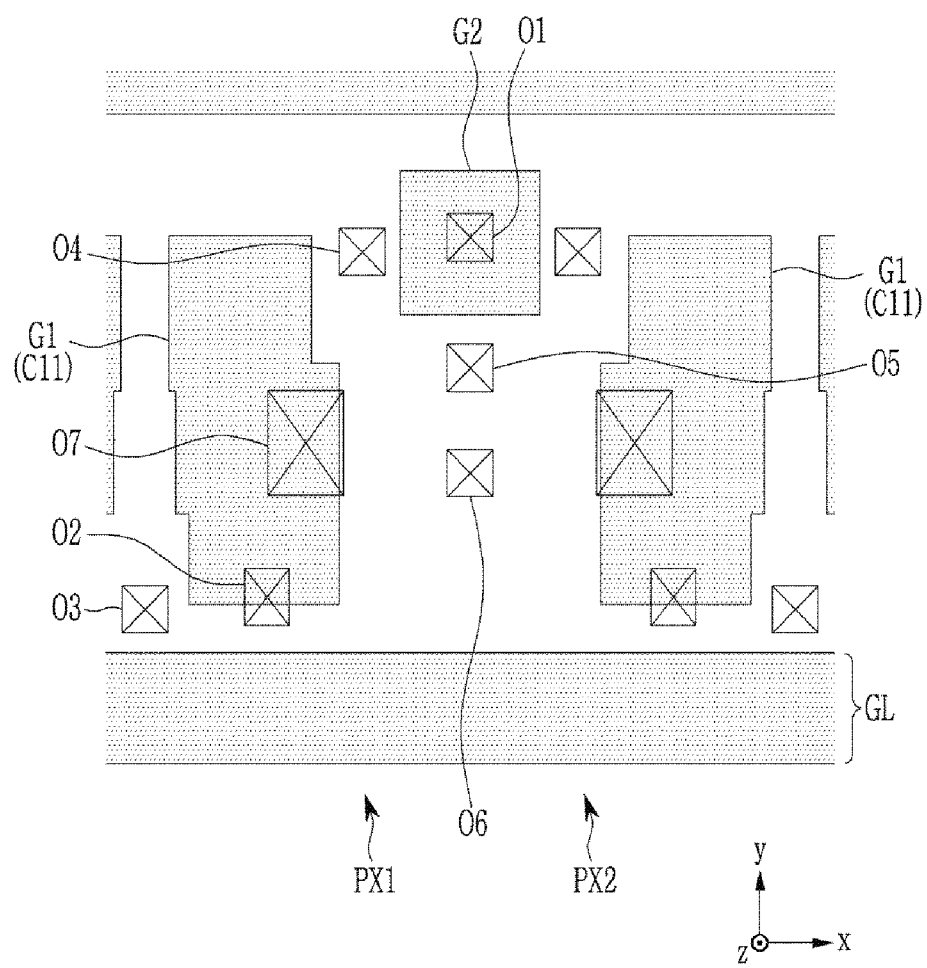
FIG. 7 is a top plan view illustrating only a first gate conductor of FIG. 3 according to an embodiment.
Figure 8:
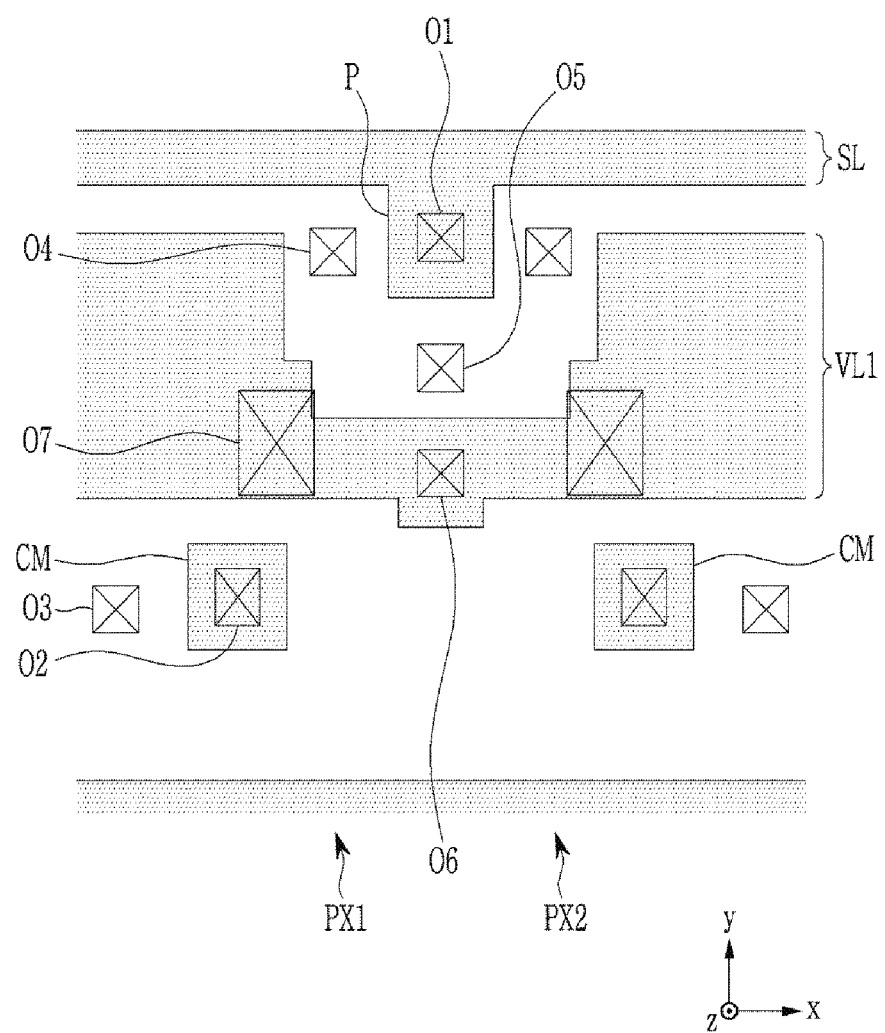
FIG. 8 is a top plan view illustrating only a second gate conductor of FIG. 3 according to an embodiment.
Figure 9:
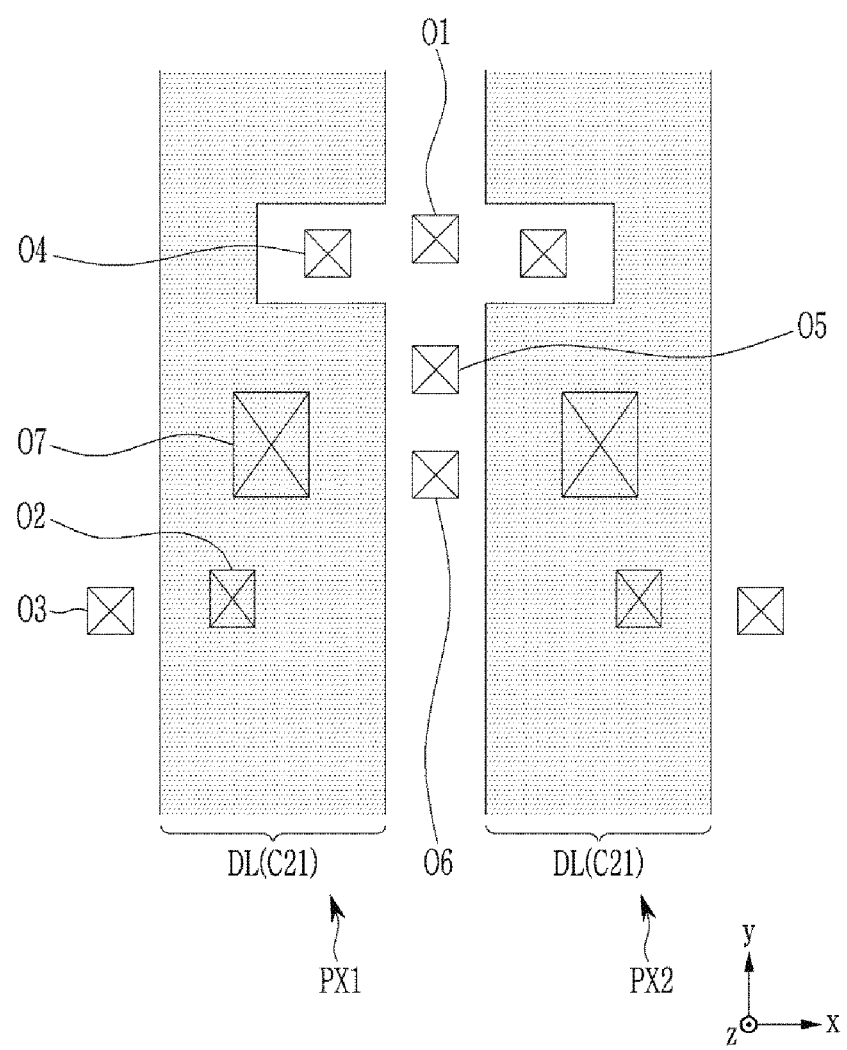
FIG. 9 is a top plan view illustrating only a first data conductor of FIG. 3 according to an embodiment.
Figure 10:
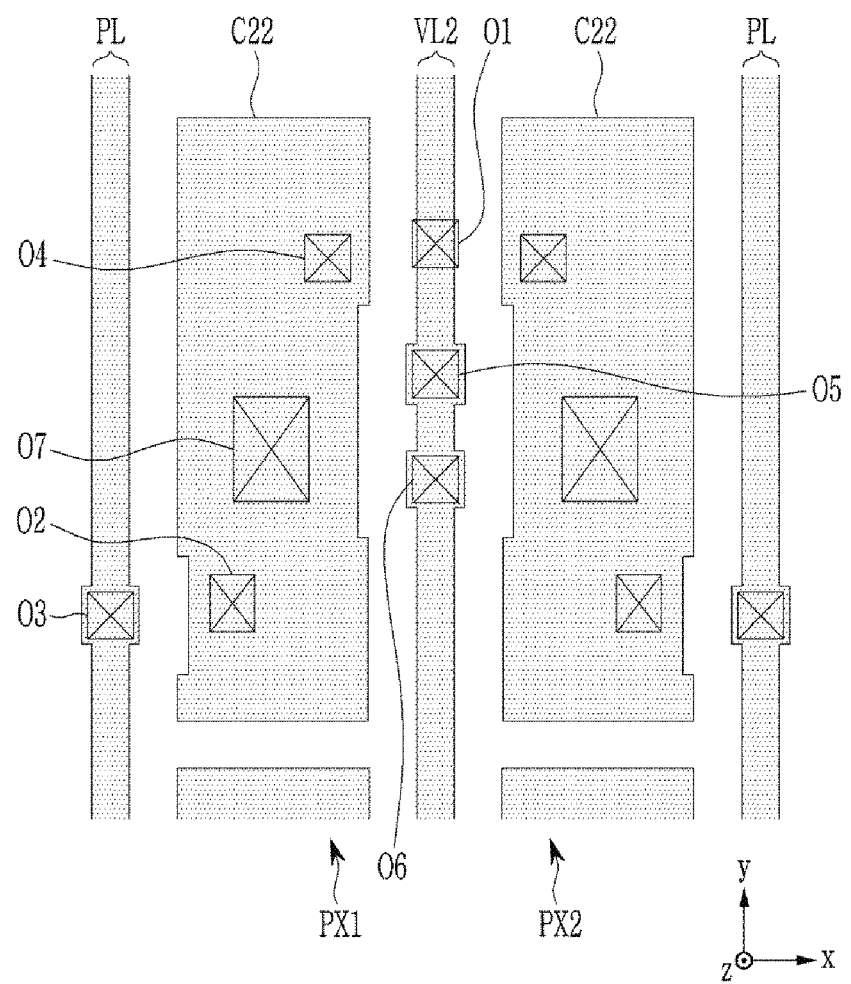
FIG. 10 is a top plan view illustrating only a second data conductor of FIG. 3 according to an embodiment.

FIG. 3 is a layout view of two pixel areas of a display device according to an embodiment. FIG. 4 is a cross-sectional view of the display device of FIG. 3 taken along line IV-IV' according to an embodiment. FIG. 5 is a cross-sectional view of the display device of FIG. 3 taken along line V-V' according to an embodiment. FIG. 6 is a top plan view illustrating only an active pattern of FIG. 3 according to an embodiment. FIG. 7 is a top plan view illustrating only a first gate conductor of FIG. 3 according to an embodiment. FIG. 8 is a top plan view illustrating only a second gate conductor of FIG. 3 according to an embodiment. FIG. 9 is a top plan view illustrating only a first data conductor of FIG. 3 according to an embodiment. FIG. 10 is a top plan view illustrating only a second data conductor of FIG. 3 according to an embodiment. For convenience of explanation, a further description of elements and aspects previously described may be omitted herein.

In FIG. 3, two pixel areas neighboring in the first direction x are illustrated. Although only one pixel area is illustrated in the second direction y, a lower end portion of a previous pixel row and an upper end portion of a next pixel row are shown to clearly show a connection relationship between pixels that are adjacent to each other in the second direction y. The active pattern and the conductors in the pixel are separately shown in FIGS. 6 to 10, and to clearly show the positional relationship between elements in FIGS. 6 to 10, openings O1, O2, O3, O4, O5, O6, and O7 shown in FIG. 3 are all shown in FIGS. 6 to 10.

Referring to FIG. 3, one pixel (PX1 or PX2) is disposed in one pixel area, and one pixel (PX1 or PX2) includes first, second, and third transistors T1, T2, and T3 and first and second capacitors C1 and C2. As described above, the third transistor T3 may include transistors T3-1 and T3-2. The first pixel PX1 and the second pixel PX2 and the signal lines SL, GL, DL, PL, and VL1 connected to the first and second pixels PX1 and PX2 may be symmetrical to each other with respect to a second initialization voltage line VL2 extending in the second direction y.

Referring to FIGS. 3 to 6, the display panel of the display device includes a substrate SB, and several layers, elements, and wires formed on the substrate SB. The substrate SB may include a polymer such as, for example, a polyimide, or an insulation material such as, for example, glass.

A buffer layer BF may be disposed on the substrate SB, and an active pattern AP may be disposed on the buffer layer BF.

The buffer layer BF may prevent dispersion of an impurity into the active pattern AP from the substrate SB during a process for forming the active pattern AP, and may reduce stress applied to the substrate SB. The buffer layer BF may include an inorganic insulating material such as, for example, a silicon nitride ($SiN_x$), a silicon oxide ($SiO_x$), etc.

As shown in FIG. 6, the active pattern AP may be bent in various shapes. The active pattern AP may include a portion extending in the first direction x and a portion extending in the second direction y. An active pattern AP of one pixel (PX1 or PX2) may form a continuum. For example, the active pattern AP of the first pixel PX1 may be connected to the active pattern AP of the second pixel PX, thereby forming one continuum. For example, in embodiments, the active patterns AP of adjacent pixels may be connected to each other, thereby forming one continuous, connected active pattern AP. The active pattern AP may include channel regions A1, A2, A3-1, and A3-2, source electrodes S1, S2, S3-1, and S3-2, and drain electrodes D1, D2, D3-1, and D3-2 of the respective transistors T1, T2, and T3. The active pattern AP may include a semiconductor material such as, for example, polysilicon, amorphous silicon, an oxide semiconductor, etc.

A first insulation layer IL1 may be disposed on the active pattern AP. The first insulation layer IL1 may also be called a first gate insulation layer. The first insulation layer IL1 may include an inorganic insulating material such as, for example, a silicon nitride, a silicon oxide, etc.

Referring to FIGS. 3 to 5 and 7, a first gate conductor that includes the gate line GL, a first gate electrode G1, and a second gate electrode G2 may be disposed on the first insulation layer IL1. The first gate conductor may include a metal such as, for example, molybdenum (Mo), copper (Cu), aluminum (Al), silver (Ag), chromium (Cr), tantalum (Ta), titanium (Ti), etc. The first gate conductor may be made of the same material and may be made in the same process.

The gate line GL may extend in the first direction x, and may be continuously disposed over the first and second pixels PX1 and PX2. The gate line GL may include the gate electrode G3-1 of the first third transistor T3-1 and the gate electrode G3-2 of the second third transistor T3-2. The gate electrode G3-1 and the gate electrode G3-2 may correspond to portions of the gate line GL overlapping the active pattern AP. The first gate electrode G1 and the second gate electrode G2 may be substantially formed in the shape of a rectangle, and may have island forms. The first gate electrode G1 may include a first electrode C11 of the first capacitor C1.

As shown in FIG. 4, the first gate electrode G1 may form the first transistor T1 together with a first channel region A1, a first source electrode S1, and a first drain electrode D1 of the active pattern AP. The first gate electrode G1 may overlap the channel region A1, and the first source electrode S1 and the first drain electrode D1 may be disposed at opposite sides of the first channel region A1. The first channel region A1 may be bent at least once. Accordingly, a driving range may be widened by increasing the length of the first channel region A1, and the influence of the direction in a manufacturing process may be compensated to reduce the influence of process spread. In the illustrated embodiment, the first channel region A1 is bent two times. However, embodiments are not limited thereto.

As shown in FIG. 4, the second gate electrode G2 may form the second transistor T2 together with a channel region A2, a second source electrode S2, and a second drain electrode D2 of the active pattern AP. The second gate electrode G2 may overlap the second channel region A2, and the second source electrode S2 and the second drain electrode D2 may be disposed at opposite sides of the second channel region A2. The second drain electrode D2 may be connected to the first drain electrode D1.

In the active pattern AP, the second source electrode S2, the second channel region A2, and the second drain electrode D2 of the second transistor T2 of the first pixel PX1 and the second source electrode S2, the second channel region A2, and the second drain electrode D2 of the second transistor T2 of the second pixel PX2 may substantially form a "T" shape. For example, the second transistor T2 of the first pixel PX1 and the second transistor T2 of the second pixel PX2 may share a second source electrode S2, a part of the second gate electrode G2, and a part of the second channel region A2. As a result, the degree of integration of the pixels may be increased by designing the neighboring first pixel PX1 and the second pixel PX2 to share a part of the second transistor T2.

The gate electrode G3-1 may form the first third transistor T3-1 together with the channel region A3-1, the source electrode S3-1, and the drain electrode D3-1 of the active pattern AP. The gate electrode G3-1 may overlap the channel region A3-1, and the source electrode S3-1 and the drain electrode D3-1 may be disposed at opposite sides of the channel region A3-1.

The gate electrode G3-2 may form the second third transistor T3-2 together with the channel region A3-2, the source electrode S3-2, and the drain electrode D3-2 of the active pattern AP. The gate electrode G3-2 may overlap the channel region A3-2, and the source electrode S3-2 and the drain electrode D3-2 may be disposed at opposite sides of the channel region A3-2. The source electrode S3-2 may be connected to the drain electrode D3-1. The drain electrode D3-2 may be connected to the first drain electrode D1 and the second drain electrode D2.

As described above, by forming the third transistor T3 in a two-transistor structure including transistors T3-1 and T3-2, a leakage current of the third transistor T3 can be prevented.

The first, second, and third transistors T1, T2, and T3 of the first pixel PX1 may be symmetrical to the first, second, and third transistors T1, T2, and T3 of the second pixel PX2 with respect to the second initialization voltage line VL2. For example, as shown in FIG. 3, the first transistor T1 of the first pixel PX1 may be symmetrical to the first transistor T1 of the second pixel PX2 with respect to the second initialization voltage line VL2, the second transistor T2 of the first pixel PX1 may be symmetrical to the second transistor T2 of the second pixel PX2 with respect to the second initialization voltage line VL2, and the third transistor T3 of the first pixel PX1 may be symmetrical to the third transistor T3 of the second pixel PX2 with respect to the second initialization voltage line VL2.

A second insulation layer IL2 may be disposed on the first gate conductor. The second insulation layer IL2 may also be called a second gate insulation layer. The second insulation layer IL2 may include an inorganic insulation material such as, for example, a silicon nitride, a silicon oxide, etc.

Referring to FIGS. 3 to 5 and 8, a second gate conductor that includes the scan line SL, the first initialization voltage line VL1, and a connection member CM may be disposed on and in contact with the second insulation layer IL2. The second gate conductor may include a metal such as, for example, molybdenum (Mo), copper (Cu), aluminum (Al), silver (Ag), chromium (Cr), tantalum (Ta), titanium (Ti), etc. The second gate conductor may be made of the same material and made in the same process.

The scan line SL may extend in the first direction x, and may be continuously formed throughout the first pixel PX1 and the second pixel PX2. The scan line SL may include a protrusion portion P that overlaps the second gate electrode G2 while protruding in the opposite direction of the second direction y substantially at a boundary portion of the first pixel PX1 and the second pixel PX2. The protrusion portion P may be connected to the second gate electrode G2 through an opening O1 of the second insulation layer IL2. Thus, the second transistor T2 may receive a scan signal GI transmitted through the scan line SL.

The first initialization voltage line VL1 may extend in the first direction x, and may be continuously disposed throughout the first pixel PX1 and the second pixel PX2. The first initialization voltage line VL1 may include a second electrode C12 of the first capacitor C1 overlapping the first gate electrode G1. An overlapped portion of the first initialization voltage line VL1 and the first gate electrode G1 may correspond to the second electrode C12 and the first electrode C11 of the first capacitor C1. The second electrode C12 may form the first capacitor C1 together with the first electrode C11 and the second insulation layer IL2, which is disposed between the first electrode C11 and the second electrode C12. Thus, an overlapped portion of the first electrode C11 and the second electrode C12 in the second insulation layer IL2 may function as a dielectric material of the first capacitor C1. To increase capacitance of the first capacitor C1, a portion corresponding to the second electrode C12 in the first initialization voltage line VL1 may be wider than another portion so that it can overlap with the first gate electrode G1 in a large area. The first capacitor C1 may store a charge that corresponds to a voltage difference between a voltage of the initialization voltage line VL applied to the second electrode C12 through the second electrode C12, and a voltage of the first gate electrode G1.

An opening O2 that partially exposes a top surface of the first gate electrode G1 and a part of a top surface of the source electrode S3-1 may be formed in the first insulation layer IL1 and the second insulation layer IL2. The connection member CM may connect the first gate electrode G1 to the source electrode S3-1 through the opening O2 using a side-contact method. The opening O2 may be formed through the same process as the opening O1 by using the same mask. The connection member CM may be formed through the same process as the scan line SL and the first initialization voltage line VL1 by using the same mask. Thus, the first gate electrode G1 and the source electrode S3-1 can be connected by the opening O2 and the connection member CM without adding an additional mask or process.

The opening O2 may be formed in the shape of a quadrangle such as, for example, a rectangle, and may be longer in the second direction y than in the first direction x.

When forming the opening OP2, an exposure area of the first gate electrode G1 for a stable side surface contact of the connection member CM, and capacitance of a parasitic capacitor which may be formed between the data line DL and the first gate electrode G1, can be reduced. When the capacitance of the parasitic capacitor is reduced, division of charges charged in the first capacitor C1 by the parasitic capacitor can be reduced. Therefore, since the magnitude of the data voltage stored in the first capacitor C1 used to cause the light emitting diode (LED) to emit light with a predetermined luminance can be reduced, power consumption can be reduced. In addition to a rectangular shape, the connection member CM may have a shape in which the maximum width or length is larger in the first direction x than in the second direction y. For example, in an embodiment, a shape of the connection member CM may be an oval having a short axis in the first direction x and a long axis in the second direction y. In an embodiment, the opening OP2 may have a maximum width or length that is larger in the second direction y than in the first direction x. For example, in an embodiment, the boundary of the opening O2 extending in the second direction y may be larger than the boundary of the opening O2 extending in the first direction x.

A third insulation layer IL3 may be disposed on the second gate conductor. The third insulation layer IL3 may also be called an interlayer insulation layer. The third insulation layer IL3 may include an inorganic insulation material such as, for example, a silicon nitride, a silicon oxide, etc.

Referring to FIGS. 3 to 5 and 9, a first data conductor including the data line DL may be disposed on the third insulation layer IL3. The first data conductor may include a metal such as, for example, copper (Cu), aluminum (Al), silver (Ag), chromium (Cr), molybdenum (Mo), titanium (Ti), and tantalum (Ta). The first data conductor may be formed of the same material and formed through the same process.

The data line DL may extend in the second direction y across one pixel (PX1 or PX2). The data line DL may include a first electrode C21 of the second capacitor C2. In the data line DL, the first electrode C21 may correspond to a portion that overlaps a second electrode C22 of the second capacitor C2. The data line DL may be formed in the entire pixel area, excluding an area in which the driving voltage line PL and the second initialization voltage line VL2 and an area (near an opening OP4) in which the second electrode C22 is connected to the first drain electrode D1 for a capacitance increase of the second capacitor C2. In one pixel area, a shape of the data line DL may be a rectangle having a predetermined width as a whole, but may have a shape in which an area overlapping the opening O4 is removed.

A fourth insulation layer IL4 may be disposed on the first data conductor. The fourth insulation layer IL4 may also be called a second interlayer insulation layer. The fourth insulation layer IL4 may include an inorganic insulation material such as, for example, a silicon nitride, a silicon oxide, etc.

Referring to FIGS. 3 to 5 and 10, a second data conductor that includes the driving voltage line PL, the second initialization voltage line VL2, and the second electrode C22 of the second capacitor C2 may be disposed on the fourth insulation layer IL4. As shown in FIG. 4, the second electrode C22 of the second capacitor C2 may overlap the data line DL, and the second initialization voltage line VL2 and the second electrode C22 of the second capacitor C2 may be disposed on and in contact with the fourth insulation layer IL4. Also as shown in FIG. 4, the second electrode C22 of the second capacitor C2 may be disposed between the second initialization voltage line VL2 and the driving voltage line PL. The second data conductor may include a metal such as, for example, copper (Cu), aluminum (Al), silver (Ag), chromium (Cr), molybdenum (Mo), titanium (Ti), tantalum (Ta), etc. The second data conductor may be formed of the same material and formed through the same process.

The driving voltage line PL may extend in the second direction y. The driving voltage line PL may be disposed between two pixels neighboring each other in the first direction x (e.g., the first pixel PX1 and a pixel disposed at the left side thereof, or the second pixel PX2 and a pixel disposed at the right side thereof), and may transmit a driving voltage ELVDD to the two neighboring pixels. The driving voltage line PL may be connected to the first source electrode S1 of the first transistor T1 through an opening OP3 formed in the first, second, third, and fourth insulation layers IL1, IL2, IL3, and IL4. In an embodiment, the first transistor T1 of the first pixel PX1 may receive the driving voltage ELVDD through the left-side driving voltage line PL, and the first transistor T1 of the second pixel PX2 may receive the driving voltage ELVDD through the right-side driving voltage line PL (see FIG. 10).

The second initialization voltage line VL2 may extend in the second direction y. The second initialization voltage line VL2 may be disposed between the first pixel PX1 and the second pixel PX2 that neighbor in the first direction x, or at a boundary of the first and second pixels PX1 and PX2, and may transmit an initialization voltage VINT to the first and second pixels PX1 and PX2. The second initialization voltage line VL2 may overlap the second source electrode S2 of the second transistor T2. The second initialization voltage line VL2 may be connected to the second source electrode S2 of the second transistor T2 through an opening O5 formed in the first, second, third, and fourth insulation layers IL1, IL2, IL3, and IL4. The second source electrode S2 to which the second initialization voltage line VL2 is connected may be the second source electrode S2 of the second transistor T2 of the first pixel PX1, and may also be the second source electrode S2 of the second transistor T2 of the second pixel PX2. For example, the second transistor T2 of the first pixel PX1 and the second transistor T2 of the second pixel PX2 may each be connected to the second initialization voltage line VL2. Thus, the second transistor T2 of the first pixel PX1 and the second transistor T2 of the second pixel PX2 may share a source electrode S2. As described above, the two pixels PX1 and PX2 share some configurations of the second transistor T2 and the second initialization voltage line VL2, thereby increasing pixel integration without deteriorating the characteristics of the pixel.

The second initialization voltage line VL2 may be connected to the first initialization voltage line VL1 through an opening O6 formed in the third and fourth insulation layers IL3 and IL4. Thus, the initialization voltage line VL may have a structure in which the first initialization voltage lines VL1 extending in the first direction x and the second initialization voltage lines VL2 extending in the second direction y are connected in a mesh formation. Accordingly, a uniform level of the initialization voltage VINT can be supplied throughout the entire display area.

The second electrode C22 of the second capacitor C2 may have a substantially rectangular shape, and may have a width that is sufficient to occupy most of the area between the adjacent driving voltage line PL and the second initialization voltage line VL2. A portion of the data line DL overlapping the second electrode C22 may correspond to the first electrode C21 of the second capacitor C2. The second electrode C22 may be connected to at least one of the first drain electrode D1 of the first transistor T1, the second drain electrode D2 of the second transistor T2, and the drain electrode D3-2 of the second third transistor T3-2 through the opening O4 formed in the first, second, third, and fourth insulation layers IL1, IL2, IL3, and IL4. The second electrode C22 may form the second capacitor C2 together with the first electrode C21 and the fourth insulation layer IL4, which is disposed between the first electrode C21 and the second electrode C22. Thus, an overlapping portion of the first electrode C21 and the second electrode C22 in the fourth insulation layer IL4 may function as a dielectric material of the second capacitor C2. The second capacitor C2 may store a data voltage VDAT transmitted through the data line DL. The first electrode C21 and the second electrode C22 of the second capacitor C2 are formed to have a sufficient width to increase capacitance of the second capacitor C2, thereby increase writing efficiency of the data voltage VDAT.

A fifth insulation layer IL5 may be disposed on the second data conductor. The fifth insulation layer IL5 may include an organic insulating material and/or an inorganic insulating material. The fifth insulation layer IL5 may also be called a passivation layer or a planarization layer. The organic insulating material may include, for example, a polyimide, an acryl-based polymer, a siloxane-based polymer, etc.

A first electrode E1 of the light emitting diode LED may be disposed on the fifth insulation layer IL5. The first electrode E1 may be connected to the second electrode C22 of the second capacitor C2 through an opening O7 of the fifth insulation layer IL5. The first electrode E1 may include a metal such as, for example, silver (Ag), nickel (Ni), gold (Au), platinum (Pt), aluminum (Al), copper (Cu), aluminum-neodymium (AlNd), aluminum-nickel-lanthanum (AlNiLa), etc., or a metal alloy. The first electrode E1 may include a transparent conductive material such as, for example, indium tin oxide (ITO), indium zinc oxide (IZO), etc.

A sixth insulation layer IL6 having an opening O8 that overlaps the first electrode E1 may be disposed on the fifth insulation layer IL5. The sixth insulation layer IL6 may also be called a pixel defining layer. The sixth insulation layer IL6 may include, for example, an organic insulation material.

Referring to the light emitting diode LED, an emission layer EL may be disposed on the first electrode E1, and a second electrode E2 may be disposed on the emission layer EL. The second electrode E2 may receive a common voltage ELVSS. The second electrode E2 is formed of a thin layer with a metal having a low work function such as, for example, calcium (Ca), barium (Ba), magnesium (Mg), aluminum (Al), silver (Ag), etc., or a metal alloy, such that the second electrode E2 has light transmissivity. The second electrode E2 may be formed of a transparent conductive material such as, for example, ITO and IZO.

The first electrode E1, the emission layer EL, and the second electrode E2 of each pixel (PX1 or PX2) form a light emitting diode LED. The light emitting diode LED may be, for example, an organic light emitting diode (OLED). The first electrode E1 may be an anode, and the second electrode may be a cathode. The first electrode E1 may also be called a pixel electrode, and the second electrode E2 may also be called a common electrode. In an embodiment, the light emitting diode may emit light of one of three primary colors such as, for example, red light, green light, and blue light. In an embodiment, the light emitting diode LED may emit blue light or white light.

An encapsulation layer may be disposed on the second electrode E2. The encapsulation layer may prevent permeation of moisture or oxygen. The encapsulation layer may be a thin film encapsulation layer in which at least one inorganic layer and at least one organic layer are stacked.

Hereinafter, driving of a pixel having the above-described structure will be described with reference to FIG. 11 together with FIGS. 2 and 3.

Figure 11:
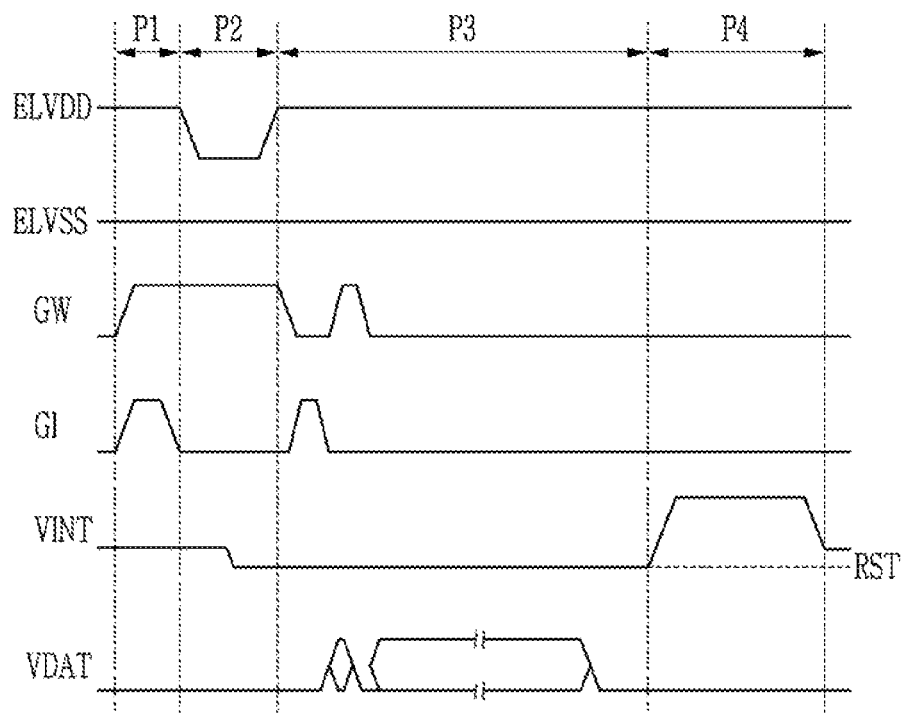
FIG. 11 is a timing diagram of signals for driving a display device according to an embodiment.

FIG. 11 is a timing diagram of signals for driving a display device according to an embodiment.

Referring to FIGS. 2, 3 and 11, the driving voltage ELVDD, the common voltage ELVSS, the gate signal GW, the scan signal GI, the initialization voltage VINT, and the data voltage VDAT may be applied to one pixel PX. The driving voltage ELVDD may be applied through the driving voltage line PL, the common voltage ELVSS may be applied through the second electrode E2, the gate signal GW may be applied through the gate line GL, the scan signal GI may be applied through the scan line SL, the initialization voltage VINT may be applied through the initialization voltage line VL, and the data voltage VDAT may be applied through the data line DL.

The pixel PX may operate over approximately four periods during one frame. For example, the pixel PX may operate over an initialization period P1, a compensation period P2, a programming period P3, and a light emission period P4.

The initialization period P1 is a period during which the first electrode E1 of the light emitting diode LED, for example, the anode, is initialized. During the initialization period P1, the initialization voltage VINT may be a low voltage, and the driving voltage ELVDD, the gate signal GW, and the scan signal GI may be high voltages. During the initialization period P1, the second transistor T2 and the third transistor T3 may be turned on, the low voltage of the initialization voltage VINT may be applied to the first node N1 and the second node N2, and the first node N1 and the second node N2 may be initialized with the initialization voltage VINT. The first electrode E1 of the light emitting diode LED is connected to the second node N2, such that the first electrode E1 may also be initialized to the low voltage of the initialization voltage VINT.

The compensation period P2 is a period during which a threshold voltage of the first transistor T1 is compensated. During the compensation period P2, the driving voltage ELVDD and the scan signal GI may be low voltages, and the gate signal GW may be a high voltage. The initialization voltage VINT may be changed to a reset voltage RST from the low voltage. During the second compensation period P2, the low voltage of the initialization voltage VINT may be applied to the first node N1. The second transistor T2 may be turned off, the third transistor T3 may be turned on, and the first gate electrode G1 and the first drain electrode D1 of the first transistor T1 may be connected by the third transistor T3. Since the first transistor T1 is diode-connected, the first gate electrode G1 may be applied with a threshold compensation voltage that corresponds to a sum of the low voltage of the driving voltage ELVDD and the threshold voltage of the first transistor T1. Accordingly, a driving current output from the first transistor T1 that flows through the light emitting diode LED may be determined regardless of the threshold voltage of the first transistor T1, and non-uniformity of the characteristics of the first transistor T1, which may occur due to process dispersion, may be prevented.

Next, the initialization voltage VINT may be changed to the reset voltage RST, and the reset voltage RST may be set to a level for resetting a voltage applied to the first electrode E1. The level of the reset voltage RST may correspond to the threshold compensation voltage (e.g., the low voltage of the driving voltage ELVDD+the threshold voltage of the first transistor T1).

The programming period P3 is a period during which the data voltage VDAT is written into the pixel PX. During the programming period P3, the data voltage VDAT may be sequentially written into the respective pixels PX for each pixel row. During the programming period P3, the driving voltage ELVDD may be a high voltage, and the initialization voltage VINT may be the reset voltage RST. In addition, when the gate signal GW is the high voltage, the scan signal GI may be a low voltage. Thus, the reset voltage RST may be applied to the first node N1, the first transistor T1 and the second transistor T2 may be turned off, and the third transistor T3 may be turned on such that the first capacitor C1 and the second capacitor C2 may be serially coupled. In this case, the data voltage VDAT transmitted through the data line DL may be divided by the first capacitor C1 and the second capacitor C2, and thus applied to the first node N1. The divided voltage applied to the first node N1 is increased as capacitance of the second capacitor C2 is increased, and the writing efficiency can be improved by increasing the capacitance of the second capacitor C2.

In the meantime, the voltage of the first electrode E1 may fluctuate due to the data voltage VDAT applied to another pixel row in the programming period P3. As a result, a leakage current may occur, and display quality deterioration, which causes luminance change according to the display area position, may occur. In order to prevent or reduce this, the scan signal GI of the high voltage is applied such that the second transistor T2 may be turned on before the third transistor T3 is turned on, and the reset voltage RST at this point is applied to the second node N2 through the second transistor T2 such that the first electrode E1 of the light emitting diode LED may be reset by the reset voltage RST.

The light emission period P4 is a period during which the driving current flows to the light emitting diode LED such that the light emitting diode LED emits light. All of the pixels PX disposed in the display area may simultaneously emit light during the light emission period P4. During the light emission period P4, the driving voltage ELVDD and the initialization voltage VINT may be high voltages, and the gate signal GW and the scan signal GI may be low voltages. As the initialization voltage VINT of the high voltage is applied, a voltage of the first node N1 may be increased by a voltage corresponding to a difference between the high voltage and the low voltage of the initialization voltage VINT. The first transistor T1 is turned on by such a voltage difference, and a driving current corresponding to the divided data voltage applied to the first node N1 may flow to the light emitting diode LED. Thus, the light emitting diode LED may emit light with a predetermined luminance as a result of the driving current.

While the inventive concept has been particularly shown and described with reference to the embodiments thereof, it is to be understood by those of ordinary skill in the art that various changes in form and detail may be made therein without departing from the spirit and scope of the inventive concept as defined by the following claims.

What is claimed is:

1. A display device, comprising:
a first pixel comprising a first transistor, a second transistor, and a third transistor;
a second pixel disposed adjacent to the first pixel in a first direction, and comprising a first transistor, a second transistor, and a third transistor; and
an initialization voltage line disposed between the first pixel and the second pixel, and extending in a second direction crossing the first direction,
wherein the second transistor of the first pixel and the second transistor of the second pixel are connected to the initialization voltage line,
the first, second, and third transistors of the first pixel and the first, second, and third transistors of the second pixel are symmetrical with respect to the initialization voltage line, and
the second transistor of the first pixel and the second transistor of the second pixel share a source electrode.

2. The display device of claim 1, wherein the initialization voltage line overlaps the source electrode and is connected to the source electrode.

3. The display device of claim 1, further comprising:
a data line that extends in the second direction across the first pixel;
an insulation layer disposed on the data line; and
a capacitor electrode that overlaps the data line,
wherein the initialization voltage line and the capacitor electrode are disposed on and in contact with the insulation layer.

4. The display device of claim 3, wherein the capacitor electrode is connected to a drain electrode of the first transistor of the first pixel.

5. The display device of claim 4, further comprising:
a driving voltage line that extends in the second direction,
wherein the capacitor electrode is disposed between the initialization voltage line and the driving voltage line.

6. The display device of claim 1, wherein a source electrode, a channel region, and a drain electrode of the second transistor of the first pixel and a source electrode, a channel region, and a drain electrode of the second transistor of the second pixel form a "T" shape.

7. A display device comprising:
a first pixel comprising a first transistor, a second transistor, and a third transistor;
a second pixel disposed adjacent to the first pixel in a first direction, and comprising a first transistor, a second transistor, and a third transistor;
an initialization voltage line disposed between the first pixel and the second pixel, and extending in a second direction crossing the first direction,
wherein the second transistor of the first pixel and the second transistor of the second pixel are connected to the initialization voltage line, and
the first, second, and third transistors of the first pixel and the first, second, and third transistors of the second pixel are symmetrical with respect to the initialization voltage line; and
another initialization voltage line that extends in the first direction across the first pixel and the second pixel,
wherein the another initialization voltage line is connected to the initialization voltage line, and the another initialization voltage line comprises a capacitor electrode that overlaps a gate electrode of the first transistor of the first pixel.

8. The display device of claim 7, further comprising:
a scan line connected to a gate electrode of the second transistor of the first pixel and a gate electrode of the second transistor of the second pixel, and extending in the first direction; and
an insulation layer disposed between the scan line and the gate electrode of the first transistor of the first pixel,
wherein the scan line and the another initialization voltage line are disposed on and in contact with the insulation layer.

9. A display device comprising:
a first pixel comprising a first transistor, a second transistor, and a third transistor;
a second pixel disposed adjacent to the first pixel in a first direction, and comprising a first transistor, a second transistor, and a third transistor; and
an initialization voltage line disposed between the first pixel and the second pixel, and extending in a second direction crossing the first direction,
wherein the second transistor of the first pixel and the second transistor of the second pixel are connected to the initialization voltage line,
the first, second, and third transistors of the first pixel and the first, second, and third transistors of the second pixel are symmetrical with respect to the initialization voltage line, and
in each of the first pixel and the second pixel, a drain electrode of the first transistor is connected to a drain electrode of the second transistor and a drain electrode of the third transistor, and a gate electrode of the first transistor is connected to a source electrode of the third transistor.

* * * * *